United States Patent
Buhari et al.

(10) Patent No.: US 11,387,734 B2
(45) Date of Patent: Jul. 12, 2022

(54) POWER CONVERTER ARCHITECTURE USING LOWER VOLTAGE POWER DEVICES

(71) Applicant: TEXAS INSTRUMENTS INCORPORATED, Dallas, TX (US)

(72) Inventors: Riazdeen Buhari, Plano, TX (US); Roy Alan Hastings, Allen, TX (US); Nghia Trong Tang, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 37 days.

(21) Appl. No.: 17/024,188

(22) Filed: Sep. 17, 2020

(65) Prior Publication Data
US 2021/0091668 A1  Mar. 25, 2021

Related U.S. Application Data

(60) Provisional application No. 62/903,421, filed on Sep. 20, 2019.

(51) Int. Cl.
*H02M 3/158* (2006.01)
*H02M 1/32* (2007.01)

(52) U.S. Cl.
CPC .......... *H02M 3/1582* (2013.01); *H02M 1/32* (2013.01)

(58) Field of Classification Search
CPC ...... H02M 3/1582; H02M 1/32; H02M 1/088; H02M 1/08; H03K 17/08122; H03K 2217/0063; H03K 2217/0072
See application file for complete search history.

(56) References Cited

U.S. PATENT DOCUMENTS

| 5,500,546 A | 3/1996 | Marum et al. |
| 8,208,275 B2 | 6/2012 | Goins et al. |
| 9,048,747 B2 | 6/2015 | Ansari |
| 9,748,842 B1 | 8/2017 | Devarajan et al. |
| 2012/0268091 A1* | 10/2012 | Takemae ............... H02M 3/158 323/272 |
| 2015/0303803 A1* | 10/2015 | Chen ..................... H02M 3/158 323/271 |
| 2016/0099640 A1* | 4/2016 | Cho ..................... H02M 3/1582 323/271 |

OTHER PUBLICATIONS

PCT Search Report for Application No. 2020/051735, dated Dec. 17, 2020.

* cited by examiner

*Primary Examiner* — Adolf D Berhane
*Assistant Examiner* — Jye-June Lee
(74) *Attorney, Agent, or Firm* — Mark A. Valetti; Charles A. Brill; Frank D. Cimino

(57) ABSTRACT

Aspects of the disclosure provide for a circuit. In at least some examples, the circuit includes a high-side power transistor, a low-side power transistor, a first transistor, a second transistor, and a third transistor. The high-side transistor is adapted to couple between an input node and a switch node. The low-side transistor is coupled between the switch node and ground. The first transistor is adapted to couple between a first node and the switch node. The second transistor is coupled between the first node and an output node. The third transistor is coupled between the first node and ground.

27 Claims, 6 Drawing Sheets

POWER CONVERTER ARCHITECTURE USING LOWER VOLTAGE POWER DEVICES

CROSS-REFERENCE TO RELATED APPLICATIONS

The present application claims priority to U.S. Provisional Patent Application No. 62/903,421, which was filed Sep. 20, 2019, is titled "Integrated Buck-Boost Converter With Low Voltage Power Devices For Supporting Automotive Load," and is hereby incorporated herein by reference in its entirety.

BACKGROUND

A switched mode power supply (SMPS) transfers power from an input power source to a load by switching one or more power transistors or other switching elements coupled through a switch node/terminal to an energy storage element (such as an inductor, an inductance of a transformer, and/or a capacitor), which is capable of coupling to the load. The power transistors can be included in a power converter that includes, or is capable of coupling to, the energy storage element. An SMPS can include an SMPS controller to provide one or more gate drive signals to the power transistor(s). The SMPS sometimes sees input voltages of sufficient magnitude to damage at least some of the power transistors unless mitigated.

The input voltage to the converter may be greater than, less than or equal to the output voltage. If the input voltage is greater than the output voltage, the converter may be referred to as a "step-down" converter/regulator or a "buck converter." If the input voltage is less than the output voltage, the converter/regulator may be referred to as a "step-up" converter/regulator or a "boost converter." If the converter/regulator can perform both step-up and step-down functions, then it may be referred to as a "buck-boost converter."

SUMMARY

Aspects of the disclosure provide for a circuit. In at least some examples, the circuit includes a high-side power transistor, a low-side power transistor, a first transistor, a second transistor, and a third transistor. The high-side transistor is adapted to couple between an input node and a switch node. The low-side transistor is coupled between the switch node and ground. The first transistor is adapted to couple between a first node and the switch node. The second transistor is coupled between the first node and an output node. The third transistor is coupled between the first node and ground.

Other aspects of the disclosure provide for a circuit. In at least some examples, the circuit includes a high-side device and a low-side transistor. The high-side transistor includes a first transistor adapted to couple between an input node and a switch node and a second transistor adapted to couple between the input node and the switch node in parallel with the first transistor. The low-side transistor is adapted to couple between the switch node and ground, wherein the switch node is adapted to couple to an energy storage component.

Other aspects of the disclosure provide for a switched mode power supply (SMPS). In at least some examples, the SMPS having an input coupled to a battery as a power source and an output adapted to couple to a load to provide regulated power to the load. The SMPS includes a power converter that includes a high-side power transistor, a low-side power transistor, a first transistor, a second transistor, and a third transistor. The high-side transistor is adapted to couple between an input node and a switch node. The low-side transistor is coupled between the switch node and ground. The first transistor is adapted to couple between a first node and the switch node via an energy storage component. The second transistor is coupled between the first node and an output node. The third transistor is coupled between the first node and ground.

Other aspects of the disclosure provide for a circuit. In at least some examples, the circuit includes a high-side power transistor, a low-side power transistor, a first transistor, a second transistor, and a third transistor. The high-side transistor is adapted to couple between an input node and a switch node. The low-side transistor is coupled between the switch node and ground. The first transistor is adapted to couple between a first node and ground. The second transistor is coupled between the first node and a third node. The third transistor is coupled between the third node and an output of the circuit.

Other aspects of the disclosure provide for a circuit. In at least some examples, the circuit includes a Zener diode, a first resistor, a second resistor, a first transistor, a second transistor, a third resistor, a third transistor, and a driver. The Zener diode has a Zener diode cathode and a Zener diode anode, the Zener diode cathode coupled to a first input of the circuit. The first resistor is coupled between the Zener diode anode and a first node. The second resistor is coupled between the first node and ground. The first transistor has a drain coupled to the first node, and a source coupled to ground. The second transistor has a gate coupled to the first node, a drain adapted to couple to a voltage source, and a source coupled to a second node. The third transistor has a drain coupled to the second node and a source coupled to ground via the third resistor. The driver has an input configured to receive a driver control signal and an output coupled to the third node, wherein the third node is an output of the circuit.

DETAILED DESCRIPTION

Figure 1:
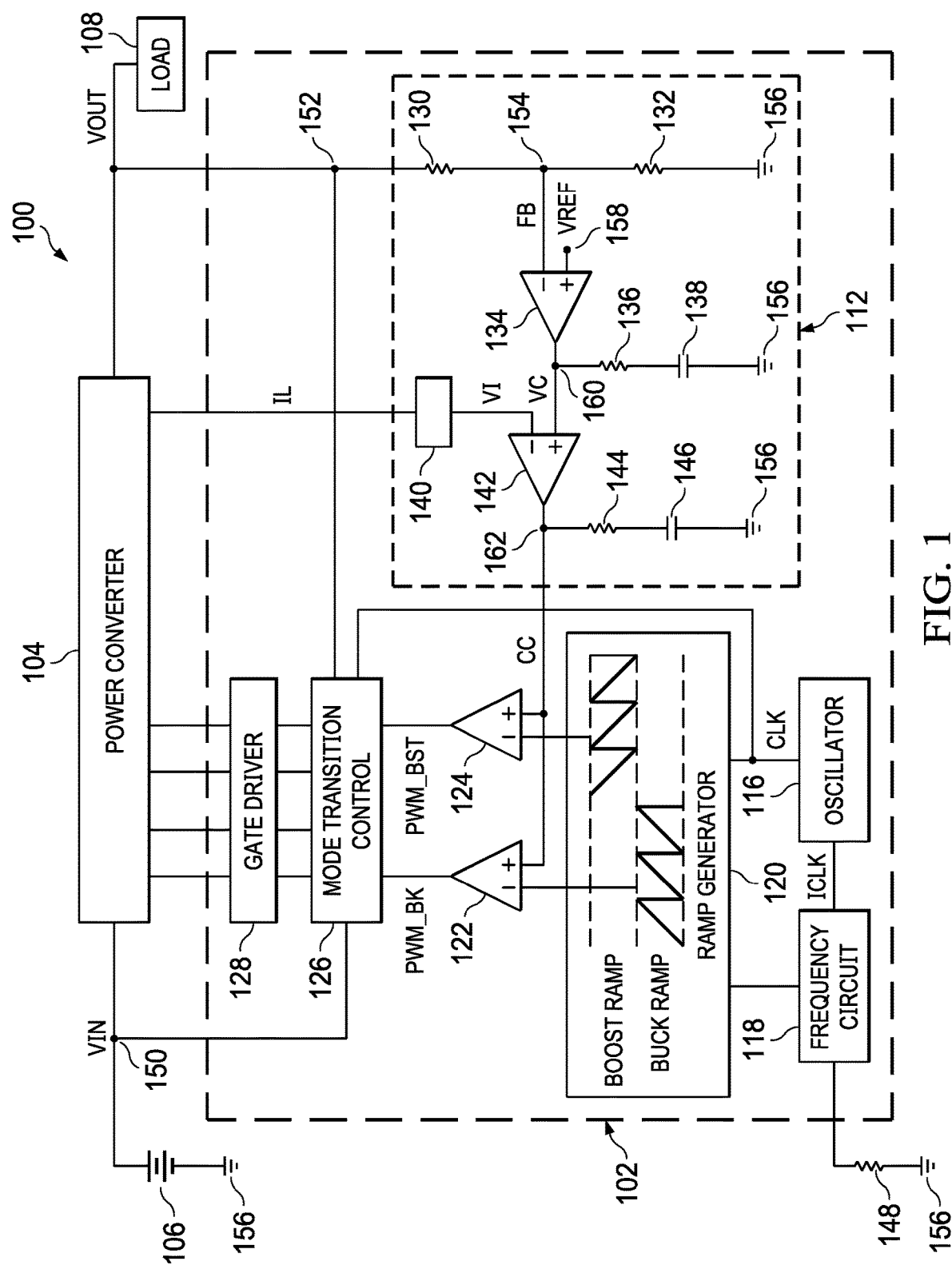
FIG. 1 shows a block diagram of an illustrative SMPS in accordance with various examples.

In some device architectures, a switched mode power supply (SMPS) includes, or is capable of coupling to, an output/bulk capacitor in parallel with the load. An SMPS controller switches power transistor(s) to form circuit arrangements with energy storage element(s) to supply a load current to the load and/or to the output/bulk capacitor to maintain a regulated output voltage. Alternatively, though not shown herein, at least some of the power transistors are instead implemented as passive switches, such as diodes. For example, a power transistor can be coupled through the switch node/terminal to an energy storage inductor during charging and/or discharging switching states of a power converter. The energy storage inductor is switched by the SMPS controller between charge and discharge switching states to supply inductor current (e.g., current through the energy storage inductor) to the load and to the output/bulk capacitor to maintain the regulated output voltage. As discussed above, in at least some examples, one or more of the power transistors are replaced by passive switches that react based on characteristics of a received input signal and are not switched by the SMPS controller. In some examples, an SMPS can be configured for operation as a constant current source with an energy storage element but with no output/bulk capacitor. Power converters periodically repeat sequences of switching states (such as "on" and "off" states). A single on/off cycle is called a switching cycle.

The power transistors can be implemented as field effect transistors (FETs), such as metal-oxide field effect transistors (MOSFETs) or any other suitable solid-state transistor devices (e.g., such as bipolar junction transistors (BJTs)). Depending on the application that a buck-boost converter is used in, the input voltage (VIN) and/or the output voltage (VOUT) of the power converter may vary. To address this, the SMPS controller will control the buck-boost converter to operate in different modes of operation. For example, based on VIN being greater than VOUT, the SMPS controller will cause the power converter to operate in a buck mode of operation. Based on VIN being less than VOUT, the SMPS controller will cause the power converter to operate in a boost mode of operation. Based on VIN being approximately equal to VOUT, the SMPS controller will cause the power converter to operate in a buck-boost mode of operation, or in alternate cycles of buck-mode and boost-mode operation. The above examples are non-exclusive and apply generally to a power converter of buck-boost topology or architecture. However, at least some of the above examples also apply to power converters of other topologies or architectures, such as buck or boost, operating under certain modes of control.

To control a mode of operation of the power converter, the SMPS controller provides gate control signals to one or more power transistors of the power converter. The gate control signals received by a power transistor controls whether the power transistor is in a conductive state (e.g., turned on) or in a non-conductive state (e.g., turned off). Each state of a power converter involves a specific combination of transistors that are in conducting states and transistors that are in non-conducting states. To change a mode of operation of the power converter, the SMPS controller modifies the sequence of switching states that it commands the transistors to assume. In at least some examples, the SMPS controller implements a state machine or other logic such that values of the gate control signals are determined based on a mode of operation of or for the power converter. Additionally, while remaining in a mode of operation of the power converter, the SMPS controller may modify a value of one or more of the gate control signals, for example, to alternatively turn on and turn off one or more power transistors.

Generally, a buck power converter and a boost power converter includes two power transistors (e.g., high- and low-side power transistors). A buck-boost power converter includes either two or four power transistors. However, these conventional power converter implementations can face certain limitations or shortcomings. For example, at least some conventional buck-boost power converters can be damaged by high input transient voltages such as those caused by load dumps and double battery events. A load dump is a fault condition in which a transient overvoltage occurs, sometimes because of a sudden disconnection of a load. Automotive or other transportation vehicle implementations of power converters may face load dump conditions. In an automotive environment, a load dump occurs, in one example, responsive to a battery that is being charged by an alternator suddenly becoming disconnected from a power bus that is shared by at least the battery and the alternator. Despite the disconnection, current continues to flow through an inductance of the alternator into the power bus. As a result, a voltage of the power bus (e.g., the bus voltage) rises, in some examples, until a transient voltage suppressor (TVS) begins conducting and thereby clamps the bus voltage to a predefined value. Devices connected to the power bus, including power converters, can become damaged if they are not designed to tolerate the voltage transient caused by the load dump event.

A double-battery event occurs when two batteries connected in series are used to jump-start a vehicle. In the case of a conventional 12 volt (V) battery system, a double-battery event can result in voltages of up to about 26 V. The rise time of a double-battery event is generally much faster than that of a load dump, but the double-battery voltage should not exceed the TVS clamp voltage. This is abusive to the system, but it is also common practice in some environments such as roll-on/roll-off transport of cars. A power converter that may be suitable for implementation in a modern automobile should be capable of withstanding such a double-battery event without sustaining damage.

Some conventional power converters are constructed with components that have voltage tolerances sufficient for withstanding the voltage spikes caused by a load dump condition. Since the TVS on a 12 V battery system typically limits voltage transients to no more than 40 V, these components should withstand voltages of up to 40 Volts. For example, for a conventional power converter operating from a 12 V battery, components of the power converter may be rated to withstand voltages of up to about 40 V to enable the power converter to withstand a load dump resulting in a voltage spike of about 40 V. However, certain disadvantages can result from the use of high-power components, such as those capable of withstanding about 40 V. For example, these higher voltage components often have a higher on resistance and require a larger gate charge to turn on as compared to lower voltage components of similar process technology. These characteristics of the higher voltage components can lead to reduced efficiency of the conventional power converter (e.g., leading to wasted or lost energy), increased size of the higher power components and therefore of the conventional power converter, and/or higher prices as compared to lower voltage components of similar process technology. Accordingly, for at least some circuit applications it may be desirable to provide the functionality in the presence of a load dump that is afforded by these higher voltage (e.g., 40 V) components while instead constructing a power converter with lower voltage (e.g., <40 V) components.

Other conventional power converters that implement hard switching (e.g., rapid turn-on and turn-off of power transistors) limit dynamic losses associated with current flow through transistors that are neither fully on nor fully off. However, hard switching also causes currents through the transistors to change rapidly. Based on these rapidly changing currents flowing through parasitic inductances such as parasitic inductances of traces, wires, or other interconnects coupled to the transistors, voltage transients are created. These voltage transients excite resonant tanks formed by parasitic inductances and capacitances of the traces, wires or other interconnects, in turn producing damped sinusoidal voltage waveforms superimposed upon the voltage levels. This phenomenon is referred to as "ringing." Ringing can, when unmitigated, can create electromagnetic interference (EMI) and can damage components in a circuit that are not capable of withstanding these increased voltages. Components that are capable of withstanding these higher voltages may not be used because they are less efficient, more costly and/or require greater space.

At least some aspects of this description relate to an architecture of, or for, a power converter, such as is suitable to be, or is, implemented in an SMPS. Other aspects of this description relate to a method for controlling a power converter. At least some examples of the power converter include five power transistors in the power converter. The five transistor configuration, in at least some examples, enables at least some of the power transistors of the power converter to withstand a load dump condition having a maximum voltage greater than a voltage rating (e.g., tolerable voltage) than some of the individual respective power transistors. For example, where a conventional power converter might include power transistors rated as 40 V devices, at least some examples of the power converter of this description utilize one or more power transistors with voltage ratings that combine to equal 40 V or more. For example, the power converter of this description may include a power transistor rated for 25 V and another power transistor rated for 15 V, while retaining an ability to tolerate a load dump condition having a maximum voltage greater than the voltage rating of the 25 V rated power transistor or the 15 V power transistor individually. To tolerate the load dump condition, in at least some examples, the power converter of this description further includes circuitry configured to detect the presence of the load dump condition and perform one or more actions based on that detection, such as biasing one or more nodes of the power converter or modifying a value of gate control signals provided to gates of one or more power transistors of the power converter.

Some examples of the high-side power transistor are implemented using multiple power transistors coupled in parallel and individually controlled. In at least some examples, the assertion of a gate control signal at a gate of one of the power transistors is delayed as compared to the assertion of a gate control signal at a gate of another of the power transistors. In this way, the power transistors can be controlled such that only some of the power transistors are turned on at a first time before turning on more of the power transistors at a second time. In at least some examples, this architecture and control scheme reduces transient currents flowing through the power transistors, such as during reverse recovery of the power converter, which can result in large transient voltages as described elsewhere herein. Reducing the transient currents limits or reduces voltage ringing while also permitting rapid turn-on of the power transistors to reduce dynamic losses, as discussed above. By limiting or reducing ringing, the overvoltage transients that can potentially damage the power converter are also reduced.

In further examples of the power converter, the multiple power transistors are controlled in a round-robin scheme. For example, during a first switching cycle a first of the multiple power transistors is turned on and the remaining power transistors are turned on at the expiration of a delay. During a second switching cycle, a second of the multiple power transistors is turned on before the remaining power transistors are turned on at the expiration of a delay. This round-robin scheme of control, in at least some examples, distributes heat dissipation among the multiple power transistors, thereby reducing peak junction temperatures of at least some of the power transistors and improving reliability of at least some of the power transistors.

Referring to FIG. 1, a block diagram of an illustrative SMPS 100 is shown. In at least one example, the SMPS 100 includes a controller 102 and a power converter 104. The SMPS 100, at least through the power converter 104, switches power provided based on a power source 106 from a node 150 to a load 108. The power converter 104 is, for example, a buck-boost power converter that is capable of operating according to a buck mode of operation, a boost mode of operation, and/or a buck-boost mode of operation. In at least one example, the controller 102 includes, or is adapted to be coupled to, a feedback circuit 112, an oscillator 116, a frequency circuit 118, a ramp generator 120, a comparator 122, a comparator 124, a mode transition control circuit 126, and a gate driver 128. The SMPS 100 of this description is shown and described as implementing average current mode control over the power converter 104. However, other control methods are possible, such as peak current mode control, voltage mode control, or any other suitable form of control implemented in a fixed frequency or variable frequency system.

At least one example of the SMPS 100 includes at least some aspects of the controller 102 and the power converter 104 on a same semiconductor die and/or in a same component package (or encapsulation), while in other examples the controller 102 and the power converter 104 may be fabricated separately and adapted to couple together. For example, at least some aspects of the controller 102 may be fabricated separately and coupled together. Accordingly, while shown as including the gate driver 128, in at least one example the controller 102 does not include the gate driver 128 and instead is adapted to couple to the gate driver 128. Similarly, other components shown as being included in the controller 102 may instead be adapted to couple, in whole or in part, to the controller 102 and not be included on a same semiconductor die and/or in a same component package as the controller 102. Similarly, components shown or described in this description as being included in the power converter 104 (such as an inductor) may instead be adapted to couple, in whole or in part, to the power converter 104 and not be included on a same semiconductor die and/or in a same component package as the power converter 104.

In at least one example, the feedback circuit 112 includes a resistor 130 coupled between a node 152 and a node 154 and a resistor 132 coupled between the node 154 and a ground node 156. The feedback circuit 112 further includes an amplifier 134 having a first input (e.g., a non-inverting input) coupled to a node 158 and configured to receive a reference voltage (VREF) at the node 158. The amplifier 134 further has a second input (e.g., an inverting input) coupled to the node 154, and an output coupled to a node 160. A feedback signal (FB) is present at the node 154 and is a scaled representation of VOUT, scaled according to a ratio of resistance of the resistor 132 to resistance of the resistor 130. A signal (VC) is present at the node 160, output by the amplifier 134 based on a difference between VREF and FB. A resistor 136 is coupled between the node 160 and a top plate of a capacitor 138 and a bottom plate of the capacitor 138 is coupled to the ground node 156. The feedback circuit 112 further includes a current sense circuit 140 and an amplifier 142. The current sense circuit 140 is adapted to couple to the power converter 104 to provide an output signal (VI) that is a voltage representation of a current flowing through the power converter 104. The amplifier 142 has a first input (e.g., a positive or non-inverting input) coupled to the node 160, a second input (e.g., a negative or inverting input) coupled to an output of the current sense circuit 140, and an output coupled to a node 162. A current control signal (CC) is present at the node 162, output by the amplifier 142 based on a difference between VC and VI. A resistor 144 is coupled between the node 162 and a top plate of a capacitor 146 and a bottom plate of the capacitor 146 is coupled to the ground node 156.

The oscillator 116, in at least some examples, is any component or components suitable for generating a clock signal, shown in FIG. 1 as CLK. A frequency of CLK is determined, in at least some examples, based on a value of a signal received from the frequency circuit 118. For example, the frequency circuit 118 provides a current signal, shown in FIG. 1 as ICLK, based at least partially on a value of a resistor 148 coupled to the frequency circuit 118. The frequency circuit 118 outputs ICLK to the oscillator 116 to enable the oscillator 116 to provide CLK at least partially according to ICLK. In at least some examples, the frequency circuit 118 further outputs ICLK to the ramp generator 120. The oscillator 116 outputs CLK to, in some examples, the ramp generator 120 and the mode transition control circuit 126.

The ramp generator 120, in at least some examples, is any component or components suitable for generating buck and boost ramp signals for use in controlling the power converter 104. In at least some examples, the buck and boost ramp signals are provided by charging and resetting (e.g., discharging) one or more capacitors (not shown) at a specified rate of charge, specified by a current value of a signal charging the one or more capacitors. In at least some examples, based on the received CLK and ICLK signals, the ramp generator 120 outputs the buck ramp signal and the boost ramp signal.

The comparator 122 includes a first input (e.g., a positive or non-inverting input) coupled to the node 162, a second input (e.g., a negative or inverting input) coupled to the ramp generator 120 and configured to receive the buck ramp signal from the ramp generator 120, and an output. The comparator 124 includes a first input (e.g., a positive or non-inverting input) coupled to the node 162, a second input (e.g., a negative or inverting input) coupled to the ramp generator 120 and configured to receive the boost ramp signal from the ramp generator 120, and an output. In at least some examples, a control signal, shown in FIG. 1 as PWM_BK, exists at the output of the comparator 122 and a control signal, shown in FIG. 1 as PWM_BST, exists at the output of the comparator 124. In some examples, PWM_BK has an asserted value in response to CC being greater in value than the buck ramp and a de-asserted value in response to CC being less in value than the buck ramp. Similarly, in some examples, PWM_BST has an asserted value in response to CC being greater in value than the boost ramp and a de-asserted value in response to CC being less in value than the boost ramp.

The mode transition control circuit 126 has a plurality of inputs configured to receive at least CLK, PWM_BK, PWM_BST, VOUT, and VIN (sometimes collectively referred to with respect to the mode transition control circuit 126 as the received signals). In at least some examples, the mode transition control circuit 126 includes or implements a state machine to provide one or more control signals for controlling the power converter 104 according to the received signals. Operation of the mode transition control circuit 126 is described in greater detail below.

In at least one example, the SMPS 100 is configured to receive VIN from the power source 106 at the node 150 and provide VOUT at the node 152, such as for supplying the load 108. VOUT is based at least partially on VIN as present at the node 150 and VREF as received by the SMPS 100 at the node 158. VREF may be received from any suitable device (not shown) such as a processor, microcontroller, or any other device exerting control over the SMPS 100 to control a value of VOUT. In at least one example, VREF has a value representative of a specified (e.g., user-specified, target, preconfigured, programmed, etc.) value of FB. Based on a variance in value of VREF from FB, the controller 102 controls the power converter 104 to modify VOUT to cause FB to more closely match VREF. In at least some implementations, the controller 102 receives one or more signals from the power converter 104. For example, the controller 102 may receive VOUT from the power converter 104 and/or an inductor current (IL) of the power converter 104. In various examples, IL may be a value directly detected, measured, or sensed from an inductor (not shown) of the power converter 104 (or another component of the power converter 104 to which the inductor is also coupled). In at least one example, IL is provided to the feedback circuit 112 for generation of VI and VOUT is provided to the feedback circuit 112 and the mode transition control circuit 126. VI is provided based on IL, in at least some examples, by the current sense circuit 140. The current sense circuit 140 is, in some examples, a resistor.

In at least one example, the feedback circuit 112 is configured to receive VREF and VOUT (which leads to the generation of FB) and generate VC indicating a variation in FB from VREF. VC is referred to in some examples as an error signal. In at least some examples, FB is an output of a voltage divider formed of the resistor 130 and the resistor 132, where an input to the voltage divider is VOUT. VC is subsequently filtered by the resistor 136 and the capacitor 138 before being received by the amplifier 142. The amplifier 142, in at least one example, is configured to receive VC and VI and provide CC indicating a variation in VI from VC. CC is subsequently filtered by the resistor 144 and the capacitor 146 before being received by the comparator 122 and the comparator 124.

As described above, in at least one example, the frequency circuit 118 provides and outputs a signal ICLK based on a resistance of the resistor 148. ICLK at least partially determines a frequency of a clock signal CLK provided and output by the oscillator 116.

The mode transition control circuit 126 provides one or more control signals for controlling the gate driver 128 to control the power converter 104. While shown in FIG. 1 as generating and outputting four control signals to the gate driver 128, such illustration is merely one example of signals with respect to the mode transition control circuit 126. In at least one example, the mode transition control circuit 126 includes or otherwise implements a state machine (either digital or analog) to provide the control signals based on values of CLK, PWM_BK, PWM_BST, VOUT, and/or VIN.

Based on the control signals received from the mode transition control circuit 126, the gate driver 128 provides one or more gate control signals for controlling power transistors of the power converter 104, as described above. While shown in FIG. 1 as generating and outputting four gate control signals to the power converter 104, such illustration is merely one example of signals with respect to the mode transition control circuit 126. For example, the gate driver 128 provides gate control signals that alternatingly, and selectively, turn the power transistors of the power converter 104 on and off to energize and de-energize elements such as an inductor and/or a capacitor (each not shown). This energizing and de-energizing provides the buck, boost, and/or buck-boost functionality described herein. The gate driver 128 is implemented according to any suitable architecture, the scope of which is not limited herein.

As described above, in at least some examples, an alternator (not shown) or other device capable of current output may also be coupled to the node 150. When that component is an alternator and the power source 106 is a battery, the alternator may at times recharge this battery. If this battery were decoupled from the node 150 while the alternator is charging it, in some examples, a load dump occurs from the perspective of the power converter 104. Left unmitigated or uncompensated for, the load dump can detrimentally affect at least some components of the power converter 104 in various manners, as described above.

To mitigate or compensate for the load dump, in at least some examples the power converter 104 detects the presence of the load dump and biases a switch node (not shown) of the power converter 104 in response to detecting the load dump. The power converter 104 biases the switch node, in at least some examples, based on an output of a regulator circuit (not shown). Similarly, in at least some examples the power converter 104 includes an extra power transistor (e.g. such as, although not shown, a fifth power transistor in a buck-boost power converter), as described above. A gate control signal received at a gate of the extra power transistor is determined by the power converter 104 based on the detection of the load dump. For example, if the power converter 104 does not detect a load dump, in at least some examples, the gate control signal received by the extra power transistor causes the extra power transistor to remain turned-on or conductive. Conversely, based on the power converter 104 detecting the load dump, in at least some examples, the gate control signal received by the extra power transistor causes the extra power transistor to turn-off and remain turned-off or non-conductive.

Further as described above, overlap losses (e.g., losses occurring as a result of the high-side and low-side switches being turned on at the same time) of MOSFET power transistors of the power converter 104 (such as while transitioning through a saturation region of operation) decrease efficiency of the power converter 104. To compensate, the gate control signals received by the power converter 104 may sometimes be strongly driven gate control signals, thereby causing at least some of the power transistors to turn on or turn off rapidly. This rapid switching causes voltage ringing being present at the node 150. To reduce the magnitude of the voltage ringing, in at least some examples, the power converter 104 utilizes multiple power transistors, coupled in parallel, rather than a single high-side power transistor. The multiple power transistors are controlled to turn on or off at different times, such as via different gate control signals or based on a delayed version of the same gate control signal. This functionality, in at least some examples, enables the high-side power transistor to be turned on weakly prior to being turned on strongly, reducing the magnitude of the ringing while also reducing the overlap losses. For example, a portion of the multiple power transistors are controlled to turn on at a first time to turn the high-side power transistor on weakly and a second portion of the multiple power transistors are turned on at a second time to turn the high-side power transistor on strongly. In at least some examples, this staggered turn-on of the multiple transistors reduces both the overall overlap losses of the multiple power transistors and the voltage ringing at the node 150 as compared to other switching techniques.

Figure 2A:
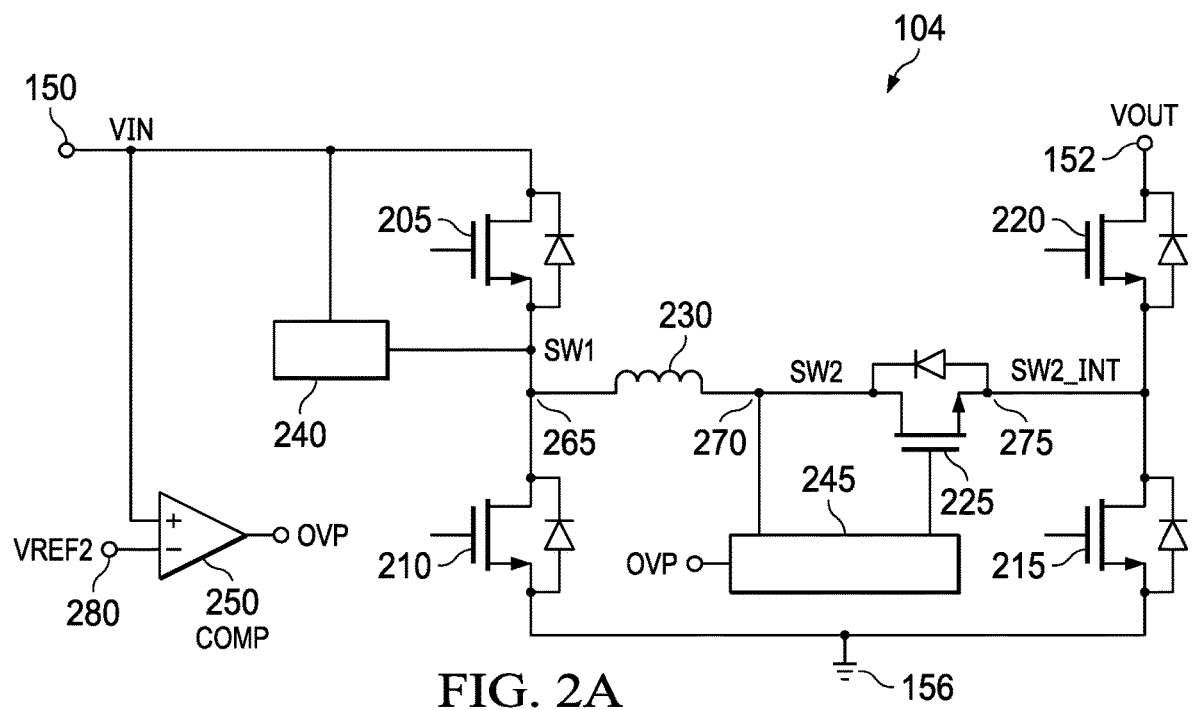
FIG. 2A shows a schematic diagram of an illustrative power converter in accordance with various examples.

Referring now to FIG. 2A, a schematic diagram of an illustrative power converter 104 is shown. In at least some examples, the power converter 104 as shown in FIG. 2A is a buck-boost power converter. However, based on which components of the power converter 104 are controlled to be conductive or non-conductive, the power converter 104 may also operate as a purely buck power converter or a purely boost power converter. Accordingly, the power converter 104 is not limited to only a buck-boost architecture. In describing the power converter 104 of FIG. 2A reference may sometimes be made to at least some components or signals of FIG. 1.

In some examples, the power converter 104 includes a plurality of FETs 205, 210, 215, 220, and 225, and at least one energy storage device (shown in this example as an inductor 230). Although not shown, in at least some examples the power converter 104 also includes an input capacitor (such as coupled between the node 150 and the ground node 156) and/or an output (e.g., bulk) capacitor (such as coupled between the node 152 and the ground node 156). In at least one example, each of the FETs 205, 210, 215, 220, and 225 are implemented as n-type MOSFETs (nMOSFETs or NFETs). In another example, though not shown in FIG. 2A, the FETs 205 and 220 are implemented as p-type MOSFETs (pMOSFETs or PFETs) and the FETs 210, 215, and 225 are implemented as NFETs. In at least some examples, at least some of the FETs 205, 210, 215, 220, and/or 225 are lateral double-diffused MOSFETs (LDMOS). The power converter 104 further includes a regulation circuit 240, a regulation circuit 245, and a comparator 250. Though not referenced individually, and not separate physical components, each of the FETs 205, 210, 215, 220, and 225 may have a built-in or inherent body diode coupled between their respective source and drain, as illustrated in FIG. 2A.

In an example architecture, a drain of the FET 205 is coupled to the node 150 and to VIN, a source of the FET 205 is coupled to a node 265, and a gate of the FET 205 is coupled to a controller (such as controller 102 of FIG. 1). The controller includes, for example, the gate driver 128. A drain of the FET 210 is coupled to the node 265, a source of the FET 210 is coupled to the ground node 156, and a gate of the FET 210 is coupled to the controller. A first terminal of the inductor 230 is coupled to the node 265 and a second terminal of the inductor 230 is coupled to a node 270. A drain of the FET 215 is coupled to a node 275, a source of the FET 215 is coupled to the ground node 156, and a gate of the FET 215 is coupled to the controller. A source of the FET 220 is coupled to the node 275, a drain of the FET 220 is coupled to the node 152 at which VOUT is present, and a gate of the FET 220 is coupled to the controller. A drain of the FET 225 is coupled to the node 270, a source of the FET 225 is coupled to the node 275, and a gate of the FET 225 is coupled to an output of the regulation circuit 245. The regulation circuit 245 further has a first input coupled to the node 270 and a second input. The regulation circuit 240 has an input coupled to the node 150 and an output coupled to the node 265. The comparator 250 has a first input (e.g., a positive or non-inverting input) coupled to the node 150, a second input (e.g., a negative or inverting input) coupled to a node 280, and an output coupled to the second input of the regulation circuit 245. In some examples, an output signal (OVP) of the comparator 250 is provided to the mode transition control circuit 126 or the gate driver 128 such that the control signals output by the mode transition control circuit 126 and/or the gate control signals output by the gate driver 128 are further based (at least partially) on an output of the comparator 250. In at least one example, the inductor 230 is implemented as an external component such that a semiconductor die that includes the power converter 104 does not also include the inductor 230, but is adapted to couple to the inductor 230 between the node 265 and the node 270.

In some examples, the FETs 205, 210, 215, 220, and/or 225 are controlled to turn on (e.g., conduct current between their respective drains and sources) and/or turn off (e.g., cease conducting current between their respective drains and sources) based on a signal received at their respective gates. For example, based on a gate control signal received from the controller (e.g., as output by the gate driver 128 under control of the mode transition control circuit 126), one or more of the FETs 205, 210, 215, and/or 220 are controlled to turn on or turn off. Based on a value of a gate control signal received from the regulation circuit 245, the FET 225 is controlled to turn on or off. The FETs 205, 210, 215, 220, and/or 225 may turn on (or off) based on a value, or relationship between values, present at one or more of their respective gates and/or sources. Based on which of the FETs 205, 210, 215, 220, or 225 are turned on at a given time, which of the FETs 205, 210, 215, 220, or 225 are turned off at a given time, and a sequence of switching of the FETs 205, 210, 215, 220, and/or 225, the power converter 104 forms circuit connections that facilitate the transfer power from the node 150 to the node 152, or alternatively, block the transfer of power form the node 150 to the node 152. Further, based on which of the FETs 205, 210, 215, 220, or 225 are turned on at a given time, which of the FETs 205, 210, 215, 220, or 225 are turned off at a given time, and a sequence of switching of the FETs 205, 210, 215, 220, and/or 225, the power converter 104 operates in a buck mode of operation, a boost mode of operation, or a buck-boost mode of operation. Alternatively, the power converter 104 can operate with a substantially same result as the buck-boost mode of operation by interleaving cycles of the buck mode of operation and cycles of the boost mode of operation when VIN is approximately equal in value to VOUT.

The regulation circuit 240 monitors a value of VIN and, based on VIN exceeding a certain value, biases the node 265. The regulation circuit 240 biases the node 265, in at least some examples, to prevent a voltage across the FET 205 (e.g., a difference in voltage between the node 150 and the node 265) from exceeding a predetermined amount. In at least some examples, the predetermined amount is determined based on a voltage rating of the FET 205. For example, for a FET 205 having a maximum drain-to-source voltage rating of 25 V, the regulation circuit 240 is configured to bias the node 265, such as in a process to prevent a voltage difference between the node 150 and the node 265 from exceeding 25 V, as discussed in greater detail elsewhere herein. More generally, for a FET 205 having a voltage rating of X, the regulation circuit 240 is configured to bias the node 265 to prevent a voltage difference between the node 150 and the node 265 from exceeding X Similarly, the regulation circuit 245 is configured to regulate a voltage difference between a signal present at the node 270 and a reference voltage (VREF3) that may be received from an external source (not shown) or internally provided by the regulation circuit 245. The comparator 250, in at least some examples, compares a value of VIN to a value of VREF2, where VREF2 is a reference voltage received at the node 280. Responsive to VIN being greater in value than VREF2, the comparator 250 outputs an over voltage protection signal (OVP) having an asserted value. Responsive to VIN not being greater in value than VREF2, the comparator 205 outputs OVP having a de-asserted value. Based on OVP being asserted, in at least some examples, the FETs 205, 210, 215, 220, and/or 225 are controlled through a unique switching configuration to be non-conductive to protect the power converter 104 and/or the load 108 from damage resulting from the value of VIN.

Based on VIN being less than VREF2, the power converter 104 operates according to gate control signals received from the controller to provide VOUT based on VIN and FB. Responsive to VIN increasing in value to be greater than VREF2, or greater than VREF2 plus a margin voltage having a sufficiently large value as to provide time for the voltage regulation and protection of this description to be initiated before a value of VIN increases to reach VREF2, the power converter 104 begins a series of operations configured to protect the power converter 104 and/or components coupled to the power converter 104, from damage resulting from the increase in value of VIN. For example, responsive to the value of VIN exceeding VREF2, the comparator 250 outputs OVP having an asserted value. Based on the asserted value of OVP, gate control signals received by the FETs 205, 210, and 220 cause those respective FETs to turn off or become non-conductive.

Responsive to assertion of OVP, the power converter 104 begins a shutdown sequence intended to protect components of the power converter 104 against damage due to voltages exceeding component ratings. In various implementations, the shutdown sequence includes any suitable number of steps. In some examples, the shutdown sequence includes four steps, as described herein. At the first step of the shutdown sequence, the FETs 205, 210, and 220 are turned off based on values of their respective gate control signals. After the FET 220 is fully off, the shutdown sequence progresses to the second step. In at least some examples, a fixed time delay is implemented to ensure that the FET 220 is fully off. In other examples, a circuit (not shown) may monitor the gate-to-source voltage of the FET 220 to determine when the gate-to-source voltage of the FET 220 decreases to be less than a gate-to-source threshold voltage of the FET 220. At the second step of the shutdown sequence, in some examples, three actions are performed. The actions may be performed sequentially in any order, substantially simultaneously, or in any other suitable sequencing prior to progressing to the third step of the shutdown sequence.

The second step of the shutdown sequence includes turning on the FET 215 based on a value of its gate control signal, electrically de-coupling the gate driver 128 for the FET 225 from the FET 225 by, for example, tri-stating its output, and enabling the regulation circuit 240. The regulation circuit 240 attempts to force the node 265 to a predetermined voltage. A current conduction capability (source or sink) of the regulation circuit 240, in at least some examples, is limited such that it is less than, or much less than, a peak current that flows through the inductor 230 during normal operation of the power converter 104. What happens next depends upon a direction of current flow through the inductor 230. If the current flowing through the inductor 230 is flowing in a direction from the node 265 to the node 270, current is drawn from regulation circuit 240, subject to its limited source capability described above. Additional current drawn by the inductor 230 beyond a sourcing capability of the regulation circuit 240 is provided by a body diode of the FET 210. Based on this current sourcing, a voltage existing at the node 265 decreases to approximately one diode forward voltage amount less than a value present at the ground node 156.

Conversely, if current is flowing in a direction from the node 270 to the node 265, the regulation circuit 240 draws current, subject to its limited sink capability described above. Additional current beyond this sink capability flows through a body diode of the FET 205. Based on this current sinking, the voltage existing at the node 265 increases to approximately one diode forward voltage greater than VIN. In the above description, it is assumed that the rate of rise of voltage VIN is such that a short period of time, such as one hundred microseconds, will pass between the beginning of the shutdown sequence and the time at which VIN will rise to a value sufficiently high that the FET 210 would be damaged by exposure to a voltage equal to VIN plus one diode forward drop.

The third step of the shutdown sequence begins subsequent to the FET 215 becoming fully turned-on or enabled. In at least some examples, a fixed time delay is implemented to ensure that the FET 215 is fully on. In other examples, a circuit (not shown) may monitor the gate-to-source voltage of the FET 215 to determine when the gate-to-source voltage of the FET 215 increases to be a value sufficient to fully turn-on the FET 215. Subsequent to the FET 215 becoming fully enabled, the fourth step of the shutdown sequence may commence subject to a value of the voltage that exists at the node 265. If the voltage that exists at the node 265 is greater in value than a predetermined voltage value, such as approximately 1 V, then the shutdown sequence continues to the fourth and final step. Otherwise, the regulation circuit 245 is enabled and begins to reduce the gate-to-source voltage of the FET 225.

As the gate-to-source voltage of the FET 225 decreases, the FET 225 moves from a linear region of operation into a saturation region of operation. Responsive to the drain current of the FET 225 decreasing to an amount less than the current flowing through inductor 230, the voltage that exists at the node 270 begins to increase. The regulation circuit 245 then adjusts the gate-to-source voltage of the FET 225 to attempt to maintain the voltage at the node 270 at a desired target voltage, such as a voltage VREF3. In at least some examples, VREF3 is a voltage internally provided or provided by the regulation circuit 245. In other examples, although not shown, VREF3 is received by the regulation circuit 245 from another component or circuit. As the current flowing through the inductor 230 decreases, the regulation circuit 245 gradually reduces the gate-to-source voltage of the FET 225. Eventually the inductor current of the inductor 230 decreases to approximately zero and the regulation circuit 245 fully turns off the FET 225. Because current is now no longer flowing through the body diode of the FET 210, the regulation circuit 240 pulls the voltage at the node 265 above the value present at the ground node 156. Responsive to this voltage existing at the node 265 exceeding the predefined voltage value mentioned above with respect to termination of the third step of the shutdown sequence and beginning of the fourth step (e.g. 1 V), the regulation circuit 245 holds the FET 225 turned off and the third step ends. Subsequently, the fourth step of the shutdown sequence commences.

At the fourth step of the shutdown sequence, the regulation circuit 240 pulls the voltage at the node 265 up to a target value. The target voltage is, in some examples, sufficiently high as to protect the FET 205 from damage while sufficiently low so as not to damage the FET 225. For a regulation circuit configured to protect a power converter 104 against a VIN of about 40 V with a 25 V rated FET 205, in at least some examples the target value is about 16 V. Subsequently, the drain-to-source voltage of the FET 205 (VDS205) approximately equals VIN minus a value of the voltage that exists at the node 265. VDS205 is therefore less than VIN. Therefore, a maximum drain-to-source voltage rating of the FET 205, or the drain-to-source voltage that the FET 205 can tolerate without damage, need not equal or be greater than the maximum expected voltage on VIN during a load dump event.

The timing of load dump events is such that a significant period of time (e.g., such as about 100 microseconds) is available from the time OVP is asserted until the regulation circuit 240 regulates the node 265 such that the voltage that exists at the node 265 should be at a full value determined for protecting the FET 205. However, this period of time is not necessarily sufficient to discharge the energy stored in the inductor 230 if current is flowing from the node 265 to the node 270 without some means of increasing the voltage across the inductor 230. For this reason, the power converter 104 includes the regulation circuit 245. If inductor current is flowing from the node 270 to the node 265, operation of the regulation circuit 245 is not needed because the only path for the current to flow is through the body diode of the FET 205, thus placing a voltage approximately equal to VIN minus two diode forward voltages across the inductor 230, which is sufficient to rapidly reduce the current through the inductor 230 to approximately zero.

A double battery event, as discussed above, occurs when the power converter 104 is not operating, such that the FETs 205, 210, 215, 220, and 225 are all turned off. If some voltage exists at the node 150, the regulation circuit 240 operates to regulate the voltage existing at the node 265. If the voltage at the node 150 is not initially present, but is suddenly applied, an input electromagnetic interference filter, if present, moderates the rate of voltage rise at the node 150 so that a short period of time (e.g., such as microseconds) is available for the regulation circuit 240 to pull the voltage at the node 265 up before the voltage at the node 150 becomes excessively large. Protection of the power converter 104 under these conditions is provided by the regulation circuit 240 and a portion of the gate driver circuitry that maintains the FETs 205, 210, 215, and 225 in their disabled (non-conducting) state. The state of the FET 220 may be immaterial to protection of the power converter 104 against a double battery event because of the orientation of a body diode of the FET 220.

Figure 2B:
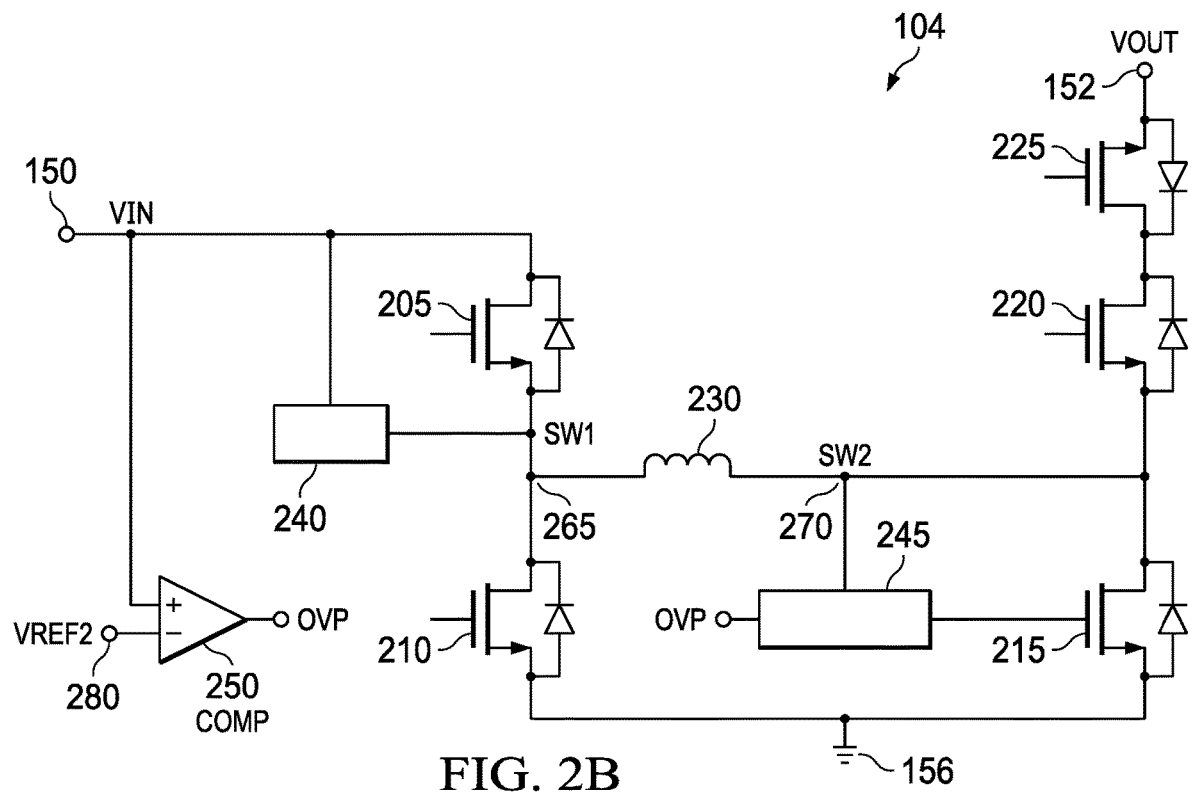
FIG. 2B shows a schematic diagram of an illustrative power converter in accordance with various examples.

In at least some examples of the power converter 104, the FET 225 is repositioned such that a drain of the FET 225 is coupled to the drain of the FET 220 and a source of the FET 225 is coupled to the node 152. In such an example, the regulation circuit 245 has a first input (e.g., a feedback input) coupled to the node 270, an enabling input coupled to the output of the comparator 250, and an output coupled to a gate of the FET 215. An example of this reconfiguration of the power converter 104 is shown in FIG. 2B in which the node 275 and the signal SW2_INT are omitted resulting from the component reconfiguration. The regulation circuit 240 of the power converter 104 of FIG. 2B, in at least some examples, controls the FET 215 in a manner substantially similar to the regulation circuit 240 controlling the FET 225 as described above with respect to FIG. 2A.

Figure 3:
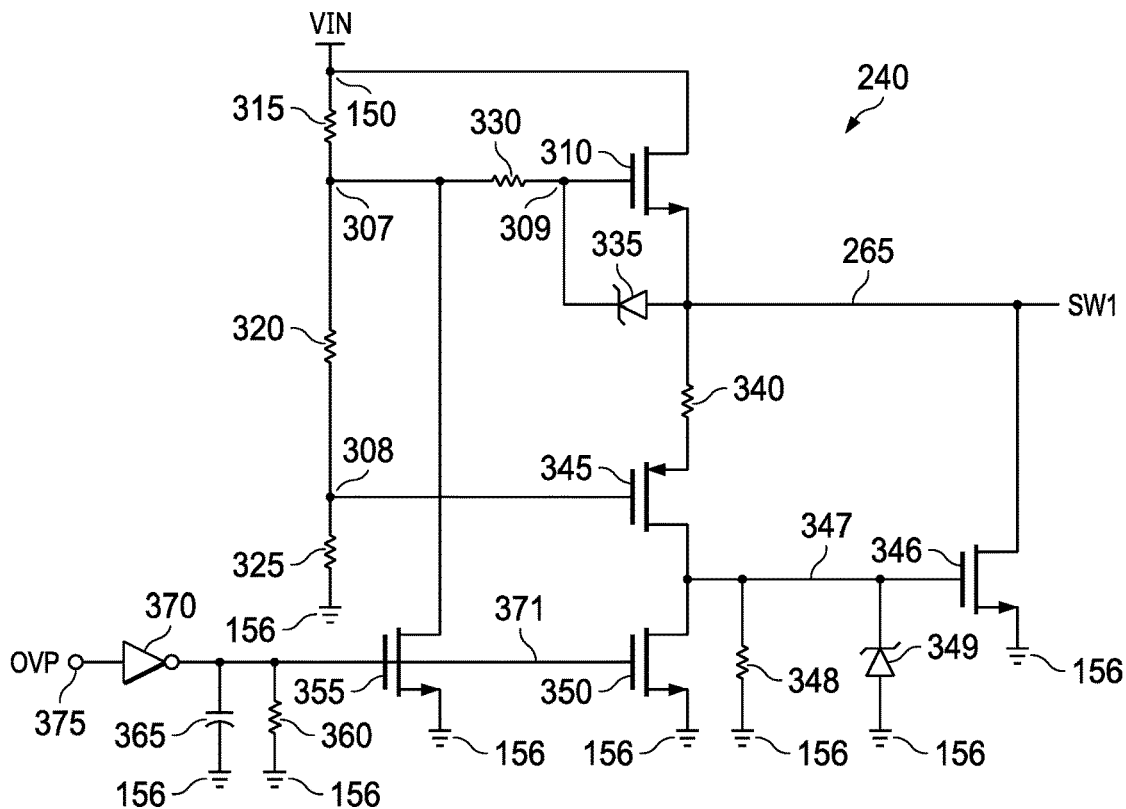
FIG. 3 shows a schematic diagram of an illustrative regulation circuit in accordance with various examples.

Referring now to FIG. 3, a schematic diagram of an illustrative regulation circuit 240 is shown. Although FIG. 3 shows one possible architecture for the regulation circuit 240, other architectures are possible and are included within the scope of this description. Put differently, the description and illustration of the illustrative regulation circuit 240 shown in FIG. 3 does not exclude other implementations of, or architectures for, the regulation circuit 240 from this description. In at least some examples, the regulation circuit 240 includes a resistor divider including resistors 315, 320, and 325. The regulation circuit 240 further includes an n-channel FET 310, a resistor 330, a Zener diode 335, a resistor 340, a p-channel FET 345, an n-channel FET 346, a resistor 348, a Zener diode 349, an n-channel FET 350, an n-channel FET 355, a resistor 360, a capacitor 365, and an inverter 370.

In an example architecture of the regulation circuit 240, the resistor 315 is coupled between the node 150 and a node 307. The resistor 320 is coupled between the node 307 and a node 308. The resistor 325 is coupled between the node 308 and the ground node 156. The resistor 330 is coupled between the node 307 and a node 309. A gate of the FET 310 is coupled to the node 309, a drain of the FET 310 is coupled to the node 150, and a source of the FET 310 is coupled to the node 265 (e.g., the node being regulated by the regulation circuit 240). A cathode of the Zener diode 335 is coupled to the node 309 and an anode of the Zener diode 335 is coupled to the node 265. A gate of the FET 345 is coupled to the node 308, a source of the FET 345 is coupled through the resistor 340 to the node 265, and a drain of the FET 345 is coupled to a node 347. A gate of the FET 350 is coupled to a node 371, a drain of the FET 350 is coupled to the node 347, and a source of the FET 350 is coupled to the ground node 156. A gate of the FET 346 is coupled to the node 347, a drain of the FET 346 is coupled to the node 265, and a source of the FET 346 is coupled to the ground node 156. The resistor 348 is coupled between the node 347 and the ground node 156. A gate of the FET 355 is coupled to the node 371, a drain of the FET 355 is coupled to the node 307, and a source of the FET 355 is coupled to the ground node 156. The resistor 360 is coupled between the node 371 and the ground node 156. The capacitor 365 is coupled between the node 371 and the ground node 156. The inverter 370 receives an enable signal (EN) from a node 375 and drives node 371 based on EN.

In an example of operation of the regulation circuit 240, in response to VIN exceeding VREF2, OVP is asserted with a logical high value such that the inverter 370 drives the node 371 with a logical low value. The logical low value is, in some examples a ground signal or signal having a value of approximately 0 V. This logical low value causes the FET 350 and the FET 355 to turn off, disabling the regulation circuit 240, such as when the regulation circuit 240 is not in use. VIN is connected to the resistor ladder that includes the resistors 315, 320, and 325 such that a fraction of VIN is applied to the gate of the FET 310. The FET 310 is configured in a source follower arrangement and pulls up the node 265 until a voltage that exists at the node 265 approximately equals VIN*(R320+R325)/(R315+R320+R325)−VGS310. In the foregoing equation, R320 is a resistance of the resistor 320, R325 is a resistance of the resistor 325, R315 is a resistance of the resistor 315, and VGS310 is a gate-to-source voltage of FET 310, which is approximately constant. Based on resistance values selected for R315, R320, and R325, the voltage that exists at the node 265 can be made to approximately track a value of VIN. For example, the resistance values selected for R315, R320, and R325 could be selected so that when VIN is approximately equal to 40 V, the voltage that the regulation circuit 240 asserts at the node 265 is approximately equal to 15 V, thereby creating a voltage differential of approximately 25 V, rather than 40 V in the absence of the regulation circuit 240, across a power transistor, or other device, coupled between the node 150 and the node 265.

Additionally, the FET 346 enables the regulation circuit 240 to sink current from the node 265, such as to mitigate leakage current or transients existing at the node 265. For example, the FET 345 begins to conduct responsive to the voltage that exists at the node 265 exceeding approximately VIN*R325/(R315+R320+R325)+VGS345, where R315, R320, and R325 are as defined above and VGS345 is a gate-to-source voltage of the FET 345. Until the voltage that exists at the node 265 exceeds approximately VIN*R325/(R315+R320+R325)+VGS345, the FET 345 conducts little or no current. While the FET 345 conducts substantial current, the current will pull up the node 347 and turn on the FET 346. The FET 346 turning on will in turn pull down the node 265 until the FET 345 no longer conducts significant current. Responsive to the reduction in current conducted by the FET 345, the resistor 348 will pull down the gate of the FET 346, turning off the FET 346 so that current will cease to flow through this FET 346.

The Zener diode 335 and the resistor 330 together form a gate oxide protection clamp that prevents the gate-to-source voltage across the FET 310 from reaching levels that may damage the gate oxide of the FET 310. Similarly, the resistor 340 and the Zener diode 349 form a gate oxide protection clamp that protects the gate oxide of the FET 346. The resistor 360 and the capacitor 365 prevent inadvertent activation of the FETs 350 and 355 due to drain-to-gate coupling of charges or residual charge present at the node 371 if power is suddenly applied to the regulation circuit 240. In response to the regulation circuit 240 becoming enabled (e.g., OVP being asserted), the enable signal received at the node 375 is pulled to a logic level high value. In response, inverter 370 pulls the node 371 to a logic level low value, disabling the FETs 350 and 355.

Figure 4:
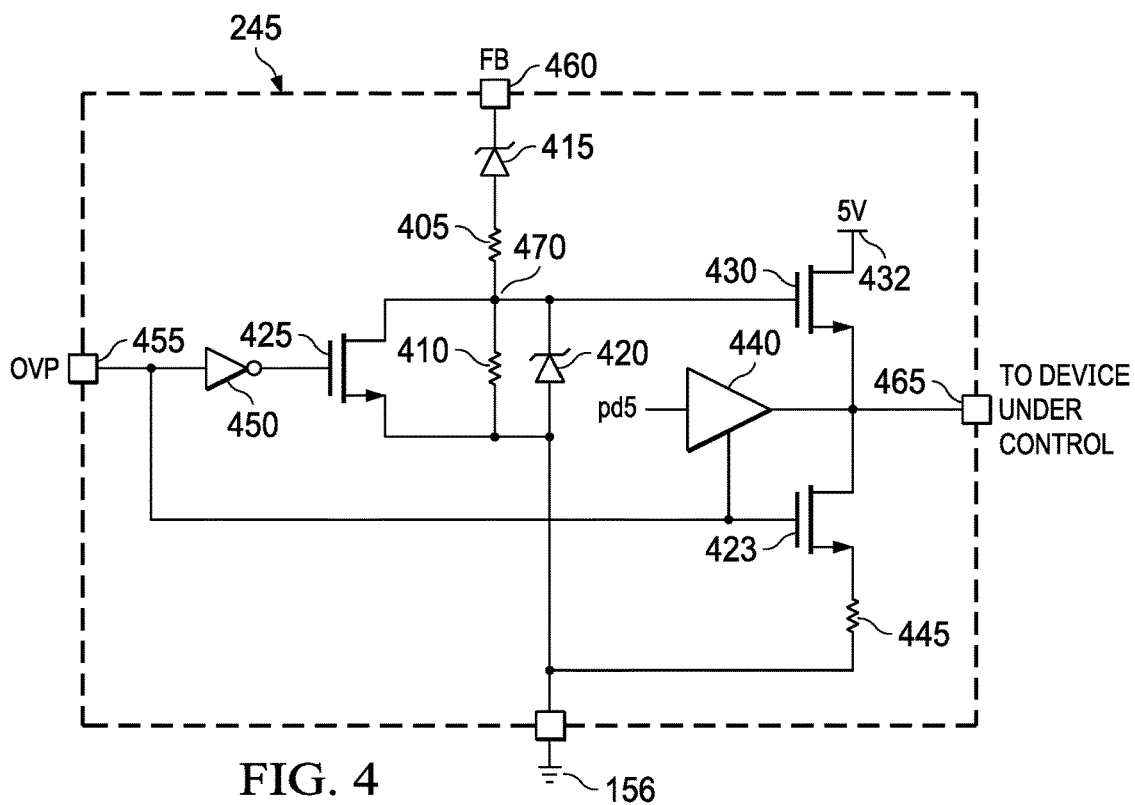
FIG. 4 shows a schematic diagram of an illustrative regulation circuit in accordance with various examples.

Referring now to FIG. 4, a schematic diagram of an illustrative regulation circuit 245 is shown. Although FIG. 4 shows one possible architecture for the regulation circuit 245, other architectures are possible and are included within the scope of this description. Put differently, the description and illustration of the illustrative regulation circuit 245 shown in FIG. 4 does not exclude other implementations of, or architectures for, the regulation circuit 245 from this description. In at least some examples, the regulation circuit 245 includes a resistor divider including resistors 405 and 410. The regulation circuit 245 further includes Zener diodes 415 and 420, n-channel FETs 425, 430, and 435, a driver 440, a resistor 445, and an inverter 450.

In an example architecture of the regulation circuit 245, a cathode of the Zener diode 415 is coupled to a feedback (FB) terminal 460 and an anode of the Zener diode 415 is coupled through the resistor 405 to a node 470. The resistor 410 is coupled between the node 470 and the ground node 156. The Zener diode 420 has a cathode coupled to the node 470 and an anode coupled to the ground node 156. The FET 425 has a drain coupled to the node 470, a source coupled to the ground node 156, and a gate. The FET 430 has a drain terminal coupled to a voltage source 432, a source coupled to a terminal 465, and a gate coupled to the node 470. The FET 435 has a drain coupled to the terminal 465, a source coupled through the resistor 445 to the ground node 156, and a gate coupled to a terminal 455. The driver 440 has an input configured to receive a signal pd5, an output coupled to the terminal 465, and a tri-state input coupled to the terminal 455. The inverter 450 has an input coupled to the terminal 455 and an output coupled to the gate of the FET 425. In at least some examples, the terminal 455 is an enable terminal that receives a signal that controls enabling or disabling of the regulation circuit 245. The signal is, in some examples, OVP as described elsewhere herein. The terminal 465 is, in some examples, an output of the regulation circuit 245 that is configured to couple to a device under regulation, such as a gate terminal of a transistor (e.g., such as the FET 215 of FIG. 2B). The voltage source 432 is, in some examples, external to the regulation circuit 245 such that the regulation circuit 245 receives a voltage from another device. The voltage, in some examples, has a value of about 5 V. In other examples, although not shown, the voltage source 432 receives a voltage, such as VIN, and provides the voltage of about 5 V, such as by processing VIN through a bandgap reference circuit. The signal pd5, in at least some examples, is a signal received from a logic circuit or state machine (not shown) configured to control the FET 225.

In an example of operation, the regulation circuit 245 becomes enabled responsive to OVP becoming de-asserted, or having a logical low value. Responsive to the regulation circuit 245 becoming enabled (e.g., OVP is low), the FET 425 becomes conductive and the driver 440 is forced into a high-impedance output state (e.g., the output is tri-stated). The FET 430 functions as a source follower, regulating a voltage at the terminal 465 to a predetermined value. In some implementations, the predetermined value is (VFB−VZ415)*R410/(R410+R405)−VGS430, where VFB is the voltage that exists at terminal 460, R410 and R405 are resistances of resistors 410 and 405, respectively, VZ415 is the breakdown voltage of the Zener diode 415, and VGS430 is the gate-to-source voltage of the FET 430. In at least some examples in which the terminal 465 couples to a gate of a FET, the voltage to which the terminal 465 is regulated is approximately equal to two times a sum of a gate-to-source voltage of the FET 430 and a gate-to-source voltage of the FET having a gate coupled to the terminal 465, plus a reverse breakdown voltage of the Zener diode 415. The Zener diode 420, in at least some examples, protects a gate oxide of the FET 430 from damage caused by voltage transients in the regulation circuit 245.

Figure 5:
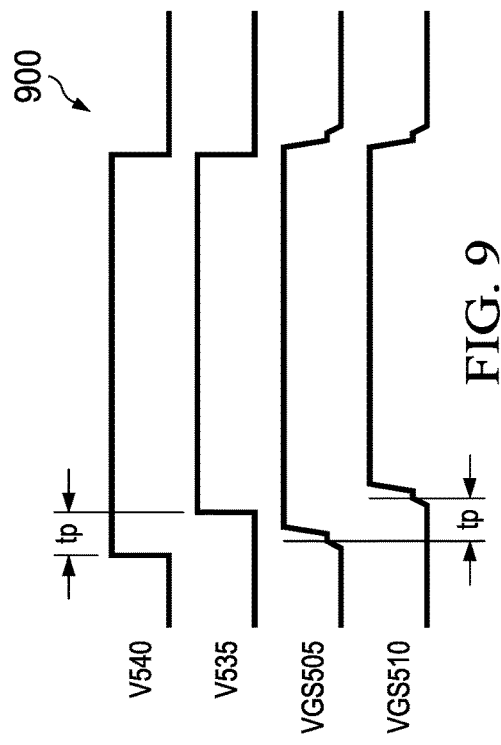
FIG. 5 shows a schematic diagram of an illustrative partial power converter in accordance with various examples.

Referring now to FIG. 5, a schematic diagram of an illustrative partial power converter 500 is shown. FIG. 5 shows a high-side switching portion of the partial power converter 500, without showing an energy storage element (such as an inductor), or other power transistors such as a low-side power transistor and/or power transistors that would be present in a buck-boost power converter. However, a remainder of the partial power converter 500 not shown in FIG. 5 may, in some examples, follow any other suitable architecture. Accordingly, some examples of the partial power converter 500 shown in FIG. 5 are suitable for implementation as a portion of the power converter 104 described above with respect to FIG. 1, FIG. 2A, and/or FIG. 2B. Other examples of the partial power converter 500 are suitable for implementation in place of a high-side power transistor of a power converter of any other suitable architecture.

As described above, overlap losses or switching losses (e.g., incurred while a high-side power transistor is operating in a saturation region of operation) are a significant source of power loss and inefficiency in conventional power converters. To mitigate these losses, power transistors are often driven strongly to reduce an amount of time that the power transistor is operating in the saturation region which itself causes a problem of increased voltage ringing in the power converter due to increased peak reverse recovery current. The partial power converter 500, in at least some examples, includes an architecture that reduces overlap losses while also mitigating the creation of voltage ringing resulting from actions taken to reduce the overlap losses.

In at least one example, the partial power converter 500 includes a FET 505 and a FET 510 coupled in parallel between a node 515 and a node 520. In at least some examples, the FET 505 and the FET 510 are collectively representative of a conventional high-side power transistor that is implemented using a single semiconductor device. Accordingly, in at least some examples the node 515 (like node 150 of FIG. 2) is adapted to be coupled to a power source 517 at which VIN is present and the node 520 is a switch node of the partial power converter 500. For example, similar to node 265 in FIG. 2, the node 520 is a node of the partial power converter 500 to which an energy storage element such as an inductor and a low-side power transistor are adapted to couple. While only two power transistors, the FET 505 and the FET 510, are shown in FIG. 5, in various examples any number of transistors may be coupled in parallel to collectively provide the functionality of a high-side power transistor in a power converter.

The FET 505 and the FET 510 are individually controlled such that the one may turn on before, or after the other. In some examples, this individual control is via independent control signals (not shown). In other examples (such as illustrated in FIG. 5), the individual control is via a control signal and a delayed version of the control signal. The control signal(s) each drive a driver, where a driver associated with the FET 505 drives the FET 505 more weakly than a driver associated with the FET 510 drives the FET 510. For example, at least one implementation of the partial power converter 500 further comprises a driver 525, a driver 530, and a delay circuit 535. In such an implementation, the driver 525 has an input coupled to a node 540 and an output coupled to a gate of the FET 505. The delay circuit 535 has an input coupled to the node 540 and an output coupled to an input of the driver 530. An output of the driver 530 is coupled to a gate of the FET 510. The delay circuit 535 includes any component(s) suitable for implementing a delay in providing a signal present at the node 540 to the input of the driver 530.

A delay caused or implemented by the delay circuit 535 is, in some examples, about 1 nanosecond. In other examples, the delay caused or implemented by the delay circuit 535 is no shorter than a period of time sufficient for the FET 505 to fully charge a diode (e.g., with a reverse recovery charge) of a low-side power transistor (not shown) also coupled to the node 520. The FET 505 is scaled such that, when turned on, a current demand of the FET 505 is less than a current demand of the FET 510 when turned on, and similarly less than a current demand when both the FET 505 and the FET 510 are turned on in parallel. In this way, by turning on the FET 505 first to provide the reverse recovery charge to a diode of the low-side power transistor prior to turning on the FET 510, a current demand placed on the power source 517 is reduced and voltage ripples in the partial power converter 500 are reduced. Furthermore, an amount of current flowing through parasitic inductances of the partial power converter 500 are reduced, resulting in reduced voltage ringing.

Figure 6:
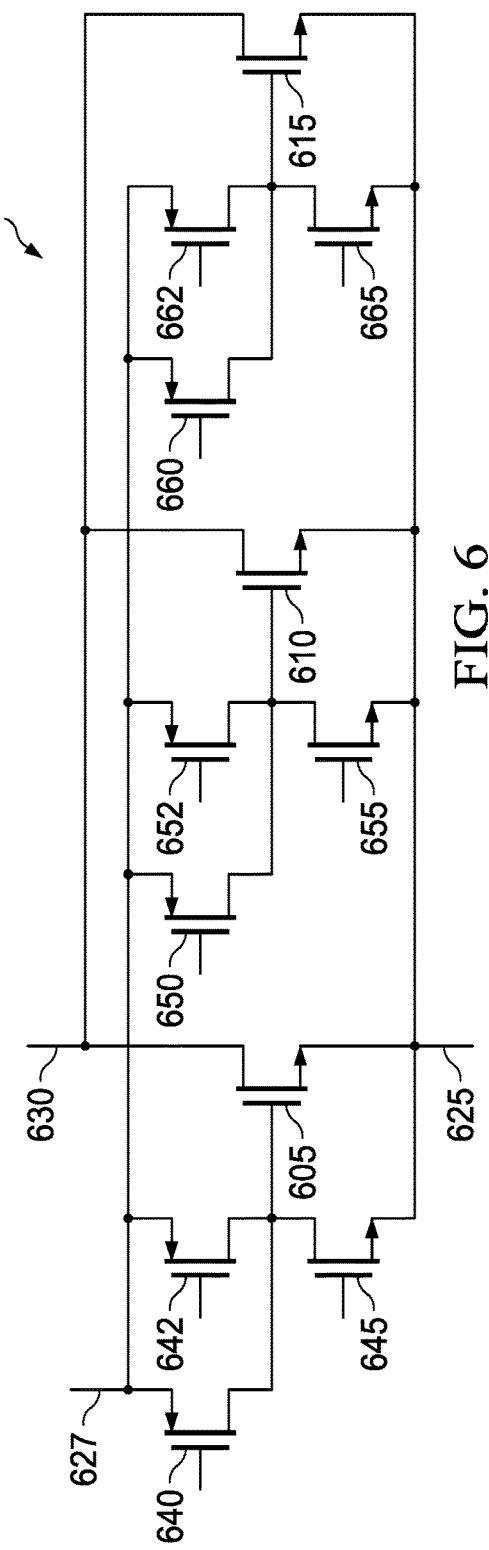
FIG. 6 shows a schematic diagram of an illustrative partial power converter in accordance with various examples.

Referring now to FIG. 6, a schematic diagram of an illustrative partial power converter 600 is shown. FIG. 6 shows a high-side switching portion of the partial power converter 600, without showing an energy storage element (such as an inductor), or other power transistors such as a low-side power transistor and/or other power transistors that would be present in a buck-boost power converter. However, a remainder of the partial power converter 600 not shown in FIG. 6 may, in some examples, follow any other suitable architecture. Accordingly, some examples of the partial power converter 600 shown in FIG. 6 are suitable for implementation as a portion of the power converter 104 described above with respect to FIG. 1, FIG. 2A, and/or FIG. 2B, such as the FET 205. Other examples of the partial power converter 600 are suitable for implementation in place of a high-side power transistor of a power converter of any other suitable architecture, or a transistor in a circuit other than a power converter.

In at least some examples, when a high-side power transistor is split into multiple power transistors, such as described above with respect to FIG. 5, heat buildup among the multiple power transistors can be uneven. This uneven heat buildup can cause some of the multiple power transistors to experience failures prematurely, prior to at least some other of the multiple power transistors, shorting an expected or usable life of a device including the multiple power transistors. To distribute heat more evenly among the multiple power transistors, in at least some examples, the multiple power transistors are formed into branches that are controlled in a round-robin manner to distribute heat distribution among the branches.

In at least one example, the partial power converter 600 includes FETs 605, 610, 615, 640, 642, 645, 650, 652, 655, 660, 662, and 665. In at least some implementations, the FETs 605, 610, 615, 645, 655, and 665 are NFETs and the FETs 640, 642, 650, 652, 660, and 662 are PFETs. In an example architecture of the partial power converter 600, the FET 605 has a drain coupled to a node 630, a source coupled to a node 625, and a gate. The FET 610 has a drain coupled to the node 630, a source coupled to the node 625, and a gate. The FET 615 has a drain coupled to the node 630, a source coupled to the node 625, and a gate. The FETs 640 and 642 each have sources coupled to a node 627, drains coupled to the gate of the FET 605, and gates. The FETs 650 and 652 each have sources coupled to the node 627, drains coupled to the gate of the FET 610, and gates. The FETs 660 and 662 each have sources coupled to the node 627, drains coupled to the gate of the FET 615, and gates. The FET 645 has a drain coupled to the gate of the FET 605, a source coupled to the node 625, and a gate. The FET 655 has a drain coupled to the gate of the FET 610, a source coupled to the node 625, and a gate. The FET 665 has a drain coupled to the gate of the FET 615, a source coupled to the node 625, and a gate.

Figure 7:
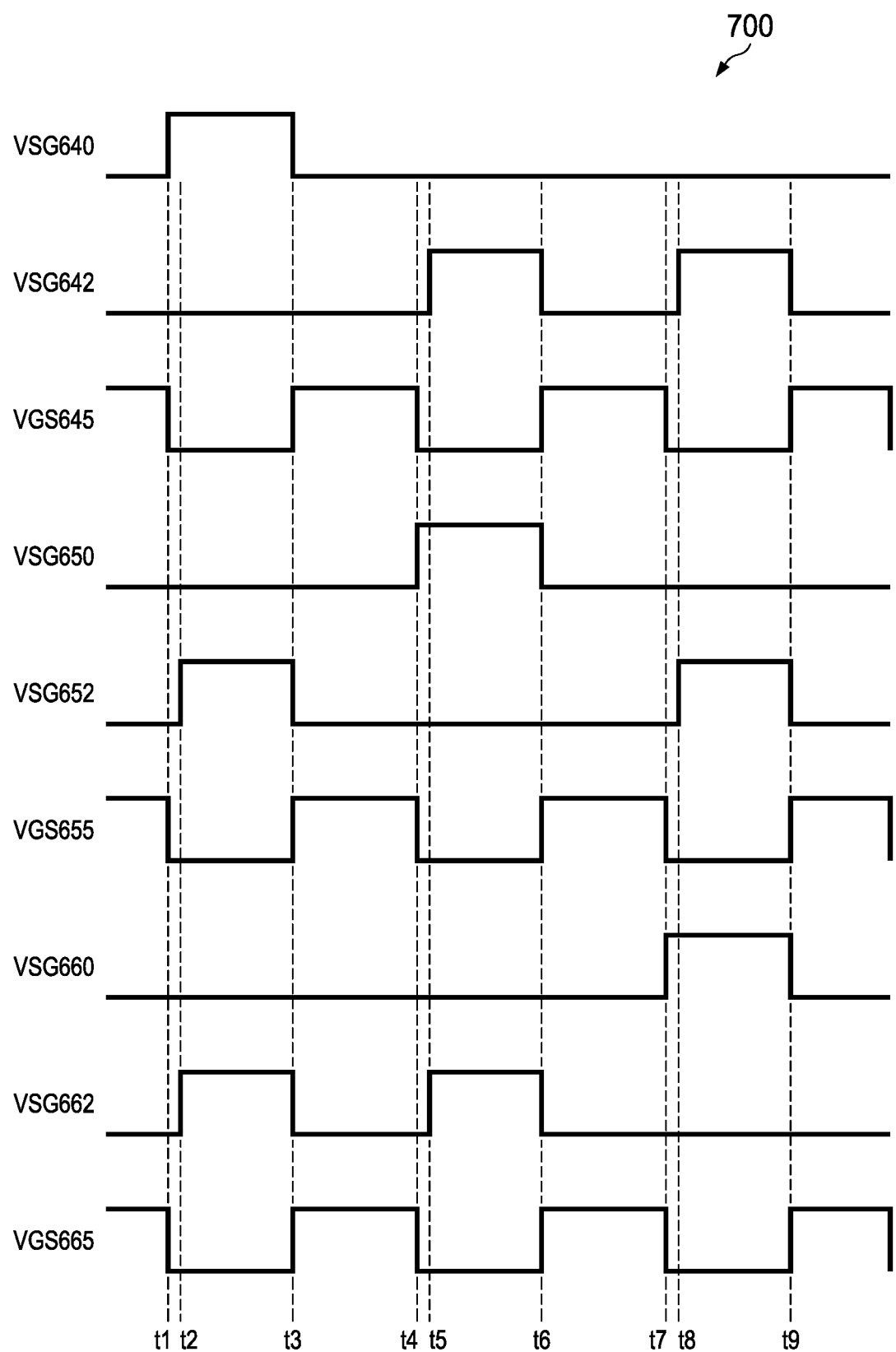
FIG. 7 shows a diagram of illustrative signal waveforms in accordance with various examples.

In at least one example, the partial power converter 600 functionally operates as a switching device, such as a transistor for which the node 630 is a drain and the node 625 is a source. For example, the partial power converter 600 is suitable for implementation in the power converter 104 illustrated in FIG. 2A or FIG. 2B such that the node 630 is equivalent to the node 150 and the node 625 is equivalent to the node 265. Accordingly, in at least some examples the partial power converter 600 is suitable for implementation as the FET 205 of the power converter 104. The partial power converter 600 is split into three branches, a first including the FETs 605, 640, 642, and 645, a second including the FETs 610, 650, 652, and 655, and a third including the FETs 615, 660, 662, and 665. The branches may be referred to as branch 605, branch 610, and branch 615, referring to the FETs of each branch that are coupled between the node 630 and 625. The FETs 640, 650, and 660 are weak-pull up devices for the FETs 605, 610, and 615, respectively. The FETs 642, 652, and 662 are strong pull-up devices for the FETs 605, 610, and 615, respectively. The FETs 645, 655, and 665 are strong pull-downs for the FETs 605, 610, and 615, respectively. The node 627 is a source of gate drive for the branches of the partial power converter 600, sometimes provided by a bootstrap capacitor circuit, or any other suitable source. In at least some examples, the gates of each of the FETs 640, 642, 645, 650, 652, 655, 660, 662, and 665 are coupled to a controller (not shown) that controls a value of a signal provided to each of the respective gate terminals. Operation of the partial power converter 600 will now be described in conjunction with FIG. 7, which shows a diagram 700 of example signal waveforms for use in a process of controlling, or driving, the partial power converter 600.

In the diagram 700, signals labeled VGS6xx refer to gate-to-source voltages of corresponding NFETs 6xx of the partial power converter 600, and signals labelled VSG6xx refer to source-to-gate voltages of corresponding PFETs 6xx. Further, when a VGS6xx or VSG6xx signal referred to below is described as going high, the corresponding transistor will begin conducting; and when it is described as going low, it will cease conducting. Additionally, whether a signal goes high or goes low, in at least some examples, is controlled by a controller coupled to the gate terminals (sometimes through drivers) of the FETs 640, 642, 645, 650, 652, 655, 660, 662, and 665.

As shown by the diagram 700, to begin a switching cycle, at a time t1 VSG640 goes high, slowly turning on branch 605. This slow turn-on shapes an inrush of current flowing through the FETs 605, 610, and 615 to a greater degree than a circuit without such functionality, such as the partial power converter 500 of FIG. 5. By time t2, branch 605 is fully enhanced and transient currents have subsided. VSG652 and VSG662 subsequently go high, turning on branches 610 and 615 quickly (e.g., such as in about 1-2 nanoseconds). At time t3, VSG640, VSG652, and VSG662 all go low, followed by VGS645, VGS655, and VGS665 going high to turn off branches 605, 610, and 615. At the end of the switching cycle, VGS645, VGS655, and VGS665 go low.

The next switching cycle begins at time t4, when VSG650 goes high, slowly turning on branch 610. By time t5, the branch 610 is fully enhanced and signals VSG642 and VSG662 rise to turn on branches 605 and 615 quickly. At time t6, signals VSG642, VSG650, and VSG662 all go low, followed by VGS645, VGS655, and VGS665 going high to turn off branches 605, 610, 615. At the end of the switching cycle VGS645, VGS655, and VGS665 go low.

The third switching cycle begins at time t7, when VSG660 goes high, slowly turning on branch 615. By time t8, branch 615 is fully enhanced and signals VSG642 and VSG652 rise to turn on branches 605 and 610 quickly. At time t9, signals VSG642, VSG652, and VSG660 go low, followed by VGS645, VGS655, and VGS665 going high to turn off branches 605, 610, and 615. At the end of the switching cycle VGS645, VGS655, and VGS665 go low.

This process as shown in the diagram 700 turns on one branch of the partial power converter 600 slowly, allows it to conduct current for a short time, and then turns on the remaining branches quickly. Which branch is chosen for first turning on slowly shifts in each switching or clock cycle so that each branch dissipates an approximately equal average amount of power.

Figure 8:
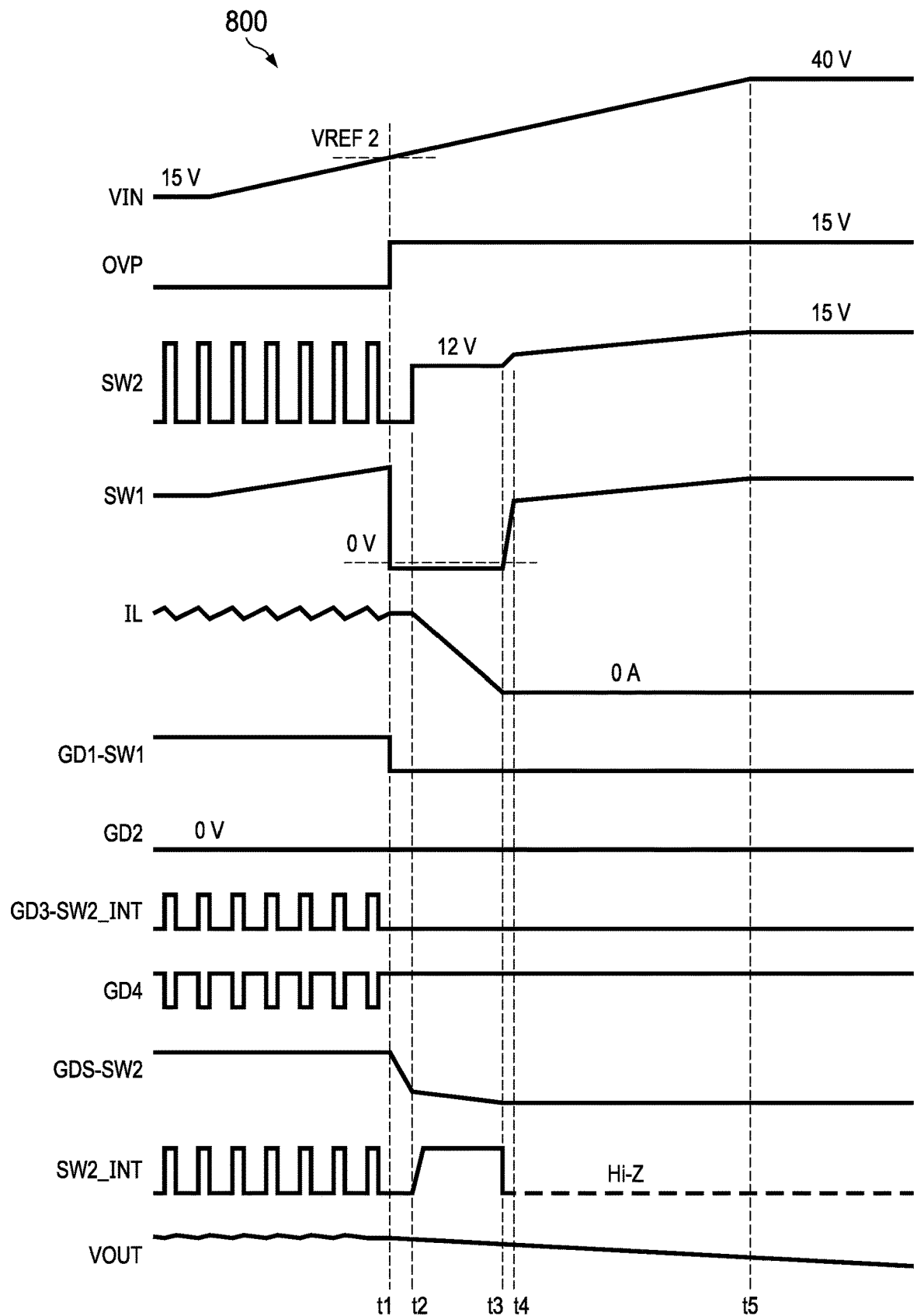
FIG. 8 shows a diagram of illustrative signal waveforms in accordance with various examples.

Referring now to FIG. 8, a diagram 800 of illustrative signal waveforms is shown. The diagram 800 corresponds to at least some implementations of the power converter 104, such as illustrated in FIG. 2A. Accordingly, reference may be made to at least some components and/or signals described above with respect to FIG. 2A, or any of the other preceding figures in describing the diagram 800. The diagram 800 shows VIN, VREF2, OVP, a signal present at the node 265 (shown as SW1), a signal present at the node 270 (shown as SW2), and IL (inductor current). The diagram 800 also shows a signal GD1-SW1 that is representative of a value of a gate drive signal received by the FET 205 minus SW1, a signal GD2 that is representative of a value of a gate drive signal received by the FET 210, and a signal GD3-SW2_INT that is representative of a value of a gate drive signal received by the FET 215 minus SW2_INIT. The diagram 800 further shows a signal GD4 that is representative of a gate drive signal received by the FET 220, a signal GD5-SW2 that is representative of a gate drive signal received by the FET 225 minus SW2, a signal present at the node 275 (shown as SW2_INT), and VOUT. For VIN, VREF2, OVP, SW, SW2, GD1-SW1, GD2, GD3-SW2_INIT, GD4, GD5-SW2, SW2_INT, and VOUT, relative voltage values are represented on a vertical axis and time is represented on a horizontal axis. For IL, a relative current value is represented on a vertical axis and time is represented on the horizontal axis. In at least some examples, the diagram 800 may be made applicable to the power converter 104 as illustrated in FIG. 2B by omitting the signal SW2_INT, replacing GD3-SW2_INT with GD3-SW2, and replacing GD5-SW2 with GD5-VOUT.

Prior to time t1, the power converter 104 is running in a normal boost mode of operation (e.g., VIN is less than VREF2), and OVP is therefore de-asserted. Correspondingly, GD1-SW1 is asserted so the FET 205 is conductive and SW1 tracks VIN in value. GD2 is de-asserted, so the FET 210 is non-conductive. GD3-SW2_INT pulses; when it is asserted, the FET 220 is conductive and SW2_INT increases to VOUT and when it is de-asserted, SW2_INT decreases to a voltage value that exists at the ground node 156 (assumed to be equal to about 0 V in FIG. 6). GD4 pulses in counter phase with GD3-SW2_INT, controlling the FET 215. GD5-SW2 is asserted such that SW2 tracks SW2_INT in value. IL ripples in response to the changing voltage of SW1 minus SW2. VOUT ripples slightly based on the ripples of IL (e.g., such as, although not shown in FIG. 2A, due to a bulk cap being charged according to IL and discharged by a load).

At t1, VIN becomes greater in value than VREF2. Responsive to VIN exceeding VREF2, OVP becomes asserted. When OVP becomes asserted, GD1-SW1 becomes de-asserted, turning off the FET 205. GD2 remains de-asserted so the FET 210 is also off and non-conductive. The inductor 230 therefore pulls SW1 one diode drop below the value that exists at the ground node 156. GD3-SW2_INT remains de-asserted, holding the FET 220 in a non-conductive state. GD4 remains asserted, so the FET 215 is conductive and SW2_INT remains at approximately the value that exists at the ground node 156. GD5-SW2 begins ramping down as the regulation circuit 245 asserts control over the FET 225. VOUT droops slightly as the load draws energy from the power converter 104.

At time t2, GD5-SW2 drops to a value sufficient to cause the FET 225 to enter a saturation region of operation. SW2 increases to the regulation voltage of the regulation circuit 245. In response, IL ramps down. VOUT drifts to a lower value because the load pulls the output of the power converter 104 down.

At time t3, IL reaches approximately zero. A body diode of the FET 210 ceases to conduct and the regulation circuit 240 pulls SW1 up. SW2_INT is now high-impedance (Hi-Z) and its output voltage can be as low as one diode drop below the value that exists at the ground node 156 or as high as one diode drop above SW2_INT.

At time t4, the regulation circuit 240 brings SW1 to the desired voltage (e.g., to a regulation or predetermined value for protecting the power converter 104 from damage). Because IL is zero at t4, SW1 tracks SW2. At time t5, VIN reaches a maximum value experienced by the power converter 104 during the switching cycle of the power converter 104 shown in FIG. 8 and SW1 and SW2 thus also reach their maximum values for this switching. While certain voltage are shown in FIG. 8 for ease of understanding, various implementations of the examples described herein may instead receive signals having voltages of different values, causing corresponding changes to values of other signals provided by the various implementations of the examples described herein.

Figure 9:
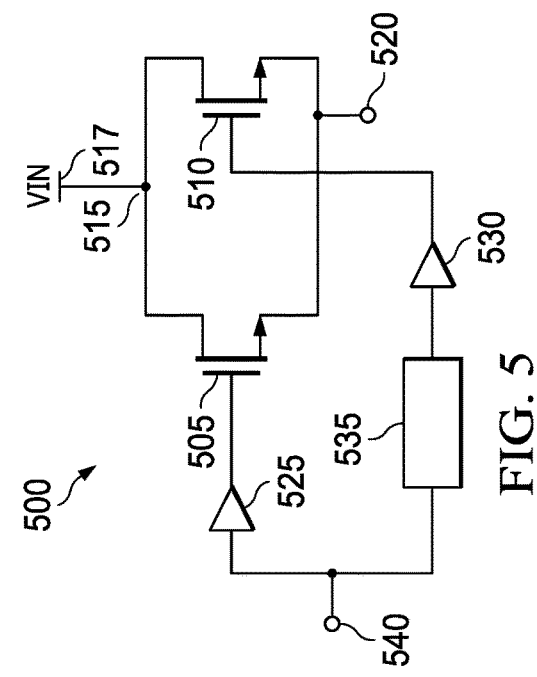
FIG. 9 shows a diagram of illustrative signal waveforms in accordance with various examples.

Referring now to FIG. 9, a diagram 900 of illustrative signal waveforms is shown. The diagram 900 corresponds to at least some implementations of the partial power converter 500. Accordingly, reference may be made to at least some components and/or signals described above with respect to FIG. 5, or any of the other preceding figures in describing the diagram 900. The diagram 900 shows a signal present at the node 540 (shown as V540), a signal present at an output of the delay circuit 535 (shown as V535), a gate-to-source voltage of the FET 505 (shown as VGS505), and a gate-to-source voltage of the FET 510 (shown as VGS510). For each signal shown in the diagram 900, relative voltage values are represented on a vertical axis and time is represented on a horizontal axis.

V540 represents an input to the partial power converter 500, such as a digital logic signal that is presumed to have sharp rise and fall times. V535 represents an output of the delay circuit 535, which is delayed by a time tp, and which is also assumed to have sharp rise and fall times. VGS505 is provided based on a signal output of the driver 525, lagging behind V540 and having a slower rise in value. This rise in value includes three components: a ramp to the gate-to-source threshold voltage of the FET 505, a horizontal run referred to as the Miller plateau (e.g., caused by drain-to-gate capacitive coupling of the FET 505), and a ramp to a full gate-to-source voltage of the FET 505. VGS510 is a similar signal provided based on a signal output of the driver 530. Assuming similar construction of the drivers 525 and 530, the onset of the Miller plateaus in VGS505 and VGS510 are separated by tp, staggering turn on of the FET 505 and the FET 510 as discussed above with respect to FIG. 5.

The term "couple" is used throughout the specification. The term may cover connections, communications, or signal paths that enable a functional relationship consistent with the description of this description. For example, if device A generates or provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated or provided by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. As another example, a resistor or capacitor shown and described herein as a single component may instead be multiple resistors or capacitor, respectively, coupled in series between the same two nodes as the single resistor or capacitor. Also, uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

Modifications are possible in the described embodiments, and other embodiments are possible, within the scope of the claims.

What is claimed is:

1. A circuit, comprising:
   a high-side transistor adapted to couple between an input node and a switch node;
   a low-side transistor coupled between the switch node and ground;
   a first transistor adapted to couple between a first node and the switch node;
   a second transistor coupled between the first node and an output node;
   a third transistor coupled between the first node and ground;
   a first regulation circuit coupled between the input node and the switch node; and
   a second regulation circuit coupled between a drain of the first transistor and a gate of the first transistor.

2. The circuit of claim 1, wherein the first regulation circuit is configured to bias the switch node.

3. The circuit of claim 2, wherein the first regulation circuit is configured to bias the switch node with a signal having a value determined according to a voltage rating of the high-side transistor.

4. The circuit of claim 3, wherein the first regulation circuit is configured to bias the switch node with a signal having a value sufficient to cause a voltage drop across the high-side transistor when the high-side transistor is non-conductive to be no greater than the voltage rating of the high-side transistor when a signal present at the input node has a voltage greater than the voltage rating of the high-side transistor.

5. The circuit of claim 1, wherein the high-side transistor comprises a fourth transistor and a fifth transistor having drain and source terminals coupled in parallel.

6. The circuit of claim 5, wherein the fourth transistor is configured to become conductive prior to the fifth transistor becoming conductive, and wherein the fourth transistor has a width smaller than a width of the fifth transistor.

7. A circuit, comprising:
   a high-side transistor adapted to couple between an input node and a switch node;
   a low-side transistor coupled between the switch node and ground;
   a first transistor adapted to couple between a first node and the switch node;
   a second transistor coupled between the first node and an output node;
   a third transistor coupled between the first node and ground; and
   a comparator having a first input coupled to the input node and a second input configured to receive a reference voltage, wherein an output signal of the comparator indicates whether a signal present at the input node exceeds a voltage rating of the high-side transistor, and wherein the output signal of the comparator is provided to the second regulation circuit as an enabling signal.

8. A circuit, comprising:
   a high-side device, comprising:
      a first transistor adapted to couple between an input node and a switch node; and
      a second transistor adapted to couple between the input node and the switch node in parallel with the first transistor; and
   a low-side transistor adapted to couple between the switch node and ground, wherein the switch node is adapted to couple to an energy storage component;
   wherein a gate terminal of the first transistor is adapted to couple to an output of a first driver and an output of a second driver, and a gate terminal of the second transistor is adapted to couple to an output of a third driver and an output of a fourth driver; and
   wherein the first driver, the second driver, the third driver, and the fourth driver each have an input adapted to couple to a round-robin controller configured to:
      control the first driver to weakly drive the first transistor beginning at a first time of a first switching cycle; and
      control the fourth driver to strongly drive the second transistor beginning at a second time of the first switching cycle.

9. The circuit of claim 8, further comprising a delay circuit, wherein a gate terminal of the first transistor is adapted to couple to an output of a driver, an input of the delay circuit is adapted to couple to the output of the driver, and wherein an output of the delay circuit is coupled to a gate terminal of the second transistor.

10. The circuit of claim 8, wherein a width of the first transistor is less than a width of the second transistor.

11. The circuit of claim 8, wherein the round-robin controller is further configured to:
control the third driver to weakly drive the second transistor beginning at a first time of a second switching cycle; and
control the second driver to strongly drive the first transistor beginning at a second time of the second switching cycle.

12. The circuit of claim 8, further comprising a third transistor adapted to couple between the input node and the switch node in parallel with the first transistor and the second transistor.

13. A switched mode power supply (SMPS) having an input coupled to a battery as a power source and an output adapted to couple to a load to provide regulated power to the load, the SMPS comprises a power converter, comprising:
a high-side transistor adapted to couple between an input node and a switch node;
a low-side transistor coupled between the switch node and ground;
a first transistor adapted to couple between a first node and the switch node via an energy storage component;
a second transistor coupled between the first node and an output node;
a third transistor coupled between the first node and ground;
a first regulation circuit coupled between the input node and the switch node; and
a second regulation circuit coupled between a drain of the first transistor and a gate of the first transistor.

14. The SMPS of claim 13, wherein the SMPS further comprises a controller coupled to the power converter and configured to provide signals for controlling the power converter based at least partially on signals detected within the SMPS.

15. The SMPS of claim 13, wherein the first regulation circuit is configured to bias the switch node with a signal having a value sufficient to cause a voltage drop across the high-side transistor when the high-side transistor is non-conductive to be no greater than the voltage rating of the high-side transistor when a signal present at the input node has a voltage greater than the voltage rating of the high-side transistor.

16. The SMPS of claim 13, wherein the high-side transistor comprises a fourth transistor and a fifth transistor having drain and source terminals coupled in parallel.

17. A circuit, comprising:
a high-side transistor adapted to couple between an input node and a switch node;
a low-side transistor coupled between the switch node and ground;
a first transistor adapted to couple between a first node and ground, wherein the first node is adapted to couple to the switch node;
a second transistor coupled between the first node and a third node;
a third transistor coupled between the third node and an output of the circuit;
a first regulation circuit coupled between the input node and the switch node; and
a second regulation circuit coupled between the first node and a gate of the first transistor.

18. The circuit of claim 17, wherein the first regulation circuit is configured to bias the switch node with a signal having a value determined according to a voltage rating of the high-side transistor.

19. The circuit of claim 18, wherein the first regulation circuit is configured to bias the switch node with a signal having a value sufficient to cause a voltage drop across the high-side transistor when the high-side transistor is non-conductive to be no greater than the voltage rating of the high-side transistor when a signal present at the input node has a voltage greater than the voltage rating of the high-side transistor.

20. The circuit of claim 17, further comprising a comparator having a first input coupled to the input node and a second input configured to receive a reference voltage, wherein an output signal of the comparator indicates whether a signal present at the input node exceeds a voltage rating of the high-side transistor, and wherein the output signal of the comparator is provided to the second regulation circuit as an enabling signal.

21. The circuit of claim 17, wherein the high-side transistor is a switching device that comprises a fourth transistor and a fifth transistor having drain and source terminals coupled in parallel.

22. The circuit of claim 21, wherein the fourth transistor is configured to become conductive prior to the fifth transistor becoming conductive, and wherein the fourth transistor has a width smaller than a width of the fifth transistor.

23. A circuit, comprising:
a Zener diode having a Zener diode cathode and a Zener diode anode, the Zener diode cathode coupled to a first input of the circuit;
a first resistor coupled between the Zener diode anode and a first node;
a second resistor coupled between the first node and ground;
a first transistor having a drain coupled to the first node, and a source coupled to ground;
a second transistor having a gate coupled to the first node, a drain adapted to couple to a voltage source, and a source coupled to a second node;
a third resistor;
a third transistor having a drain coupled to the second node and a source coupled to ground via the third resistor; and
a driver having an input configured to receive a driver control signal and an output coupled to a third node, wherein the third node is an output of the circuit.

24. The circuit of claim 23, wherein the Zener diode is a first Zener diode and the circuit further comprises a second Zener diode having a second Zener diode cathode and a second Zener diode anode, the second Zener diode cathode coupled to the first node and the second Zener diode anode coupled to ground.

25. The circuit of claim 23, further comprising an inverter having an inverter input and an inverter output, the inverter output coupled to a gate of the first transistor and the inverter input coupled to a second input of the circuit, wherein a gate of the third transistor is coupled to the second input of the circuit, and wherein the driver has a tri-state input coupled to the second input of the circuit.

26. The circuit of claim 25, wherein the circuit is configured to receive an enabling signal at the second input of the circuit, and wherein the enabling signal enables the circuit to regulate a value of a signal existing at the output of the circuit based on a value of a signal received at the first input of the circuit, a breakdown voltage of the first Zener diode, a resistance of the first resistor, a resistance of the second resistor, and a gate to source voltage of the second transistor.

27. The circuit of claim 26, wherein the signal received at the first input of the circuit is a feedback voltage and the circuit is adapted to couple at the output of the circuit to a gate of a fourth transistor.

* * * * *